United States Patent
Liao et al.

(10) Patent No.: US 7,138,763 B2
(45) Date of Patent: Nov. 21, 2006

(54) ORGANIC ELECTROLUMINESCENT DEVICES HAVING A STABILITY-ENHANCING LAYER

(75) Inventors: Liang-Sheng Liao, Rochester, NY (US); Kevin P. Klubek, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 206 days.

(21) Appl. No.: 10/713,523

(22) Filed: Nov. 14, 2003

(65) Prior Publication Data

US 2005/0104511 A1 May 19, 2005

(51) Int. Cl.
*H01L 51/00* (2006.01)
*H01L 33/00* (2006.01)

(52) U.S. Cl. .............. 313/504; 313/503; 313/506; 428/690; 428/917

(58) Field of Classification Search ............ 313/503; 428/690
See application file for complete search history.

(56) References Cited

U.S. PATENT DOCUMENTS

| | | | |
|---|---|---|---|
| 4,720,432 A * | 1/1988 | VanSlyke et al. .......... 428/457 |
| 4,769,292 A | 9/1988 | Tang et al. |
| 5,783,292 A * | 7/1998 | Tokito et al. .............. 428/212 |
| 6,013,384 A | 1/2000 | Kido et al. |
| 6,509,109 B1 | 1/2003 | Nakamura et al. |
| 6,660,411 B1 * | 12/2003 | Sato et al. ................. 428/690 |
| 6,824,950 B1 * | 11/2004 | Boroson et al. ........... 430/200 |
| 6,885,149 B1 * | 4/2005 | Parthasarathy et al. ..... 313/504 |
| 6,916,554 B1 * | 7/2005 | Ma et al. ................... 428/690 |
| 6,921,590 B1 * | 7/2005 | Hamada et al. ............ 428/690 |
| 2003/0077480 A1 | 4/2003 | Hosokawa et al. |
| 2003/0230980 A1 * | 12/2003 | Forrest et al. ............. 313/600 |
| 2004/0124767 A1 * | 7/2004 | Leung et al. .............. 313/504 |

FOREIGN PATENT DOCUMENTS

| | | |
|---|---|---|
| EP | 0 949 696 | 10/1999 |
| EP | 1 017 118 | 7/2000 |
| EP | 1 089 597 | 4/2001 |
| JP | 2003068468 | 3/2003 |

OTHER PUBLICATIONS

Tang et al, Organic electroluminescent diodes, Appl. Phys. Lett. 51 (12) Sep. 21, 1987, pp. 913-915.
Adachi et al, Electroluminescence in Organic Films with Three-Layer Structure, Japanese Journal of Applied Physics vol. 27, No. 2, Feb. 1988, pp. L269-L271.
Tang et al, Electroluminescence of doped organic thin films, J. Appl. Phys. 65 (9), May 1, 1989, pp. 3610-3616.
Van Slyke et al, Organic electroluminescent devices with improved stability, Appl. Phys. Lett. 69 (15) Oct. 7, 1996, pp. 2160-2162.

(Continued)

*Primary Examiner*—Mariceli Santiago
*Assistant Examiner*—Anne M Hines
(74) *Attorney, Agent, or Firm*—Raymond L. Owens (57) ABSTRACT

An organic light-emitting device with enhanced operational stability comprising an anode; a hole-transporting layer disposed over the anode; a light-emitting layer disposed over the hole-transporting layer for producing light in response to hole-electron recombination, wherein the light-emitting layer includes at least one organic host material and one organic luminescent dopant material; a stability-enhancing layer disposed in contact with the light-emitting layer, wherein the stability-enhancing layer includes at least one organic host material and one inorganic dopant material; an electron-transporting layer disposed over the stability-enhancing layer; and a cathode disposed over the electron-transporting layer.

42 Claims, 2 Drawing Sheets

OTHER PUBLICATIONS

Hamada et al, Influence of the Emission Site on the Running Durability of Organic Electroluminescent Devices, Jpn. J. Appl. Phys. vol. 34 (1995) pp. L824-L826.

Shi et al, Doped organic electroluminescent devices with improved stability, Appl. Phys. Lett. 70 (13) Mar. 31, 1997, pp. 1665-1667.

Choong et al, Organic light-emitting diodes with a bipolar transport layer, Applied Physics Letters, vol. 75, No. 2, Jul. 12, 1999, pp. 172-174.

Aziz et al, Organic light-emitting devices with enhanced operational stability at elevated temperatures, Applied Physics Letters, vol. 81, No. 2, Jul. 8, 2002, pp. 370-372.

Shi et al, Anthracene derivatives for stable blue-emitting organic electroluminescence devices, Applied Physics Letters, vol. 80 No. 17, Apr. 29, 2002, pp. 3201-3203.

Kido, Bright organic electroluminescent devices havinga metal-doped electron-injecting layer, Applied Physcis Letters vol. 73, No. 20 Nov. 16, 1998, pp. 2866-2868.

Hasaki et al, Lithium-aluminum contacts for organic light-emitting devices, Appl. Phys. Lett. vol. 71 No. 9, Sep. 1, 1997, pp. 1151-1153.

* cited by examiner

ORGANIC ELECTROLUMINESCENT DEVICES HAVING A STABILITY-ENHANCING LAYER

FIELD OF INVENTION

The present invention relates to improving the performance of an organic electroluminescent (EL) device. More specifically, this invention relates to improving the operational stability of an EL device.

BACKGROUND OF THE INVENTION

Organic electroluminescent (EL) devices (also known as organic light-emitting devices, organic light-emitting diodes, or OLEDs) are electronic devices that emit light in response to an applied potential. The structure of an OLED comprises, in sequence, an anode, an organic EL medium, and a cathode. The organic EL medium disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al. demonstrated highly efficient OLEDs using such a layer structure in "Organic Electroluminescent Diodes", *Applied Physics Letters*, 51, 913 (1987) and in commonly assigned U.S. Pat. No. 4,769,292. Since then, numerous OLEDs with alternative layer structures have been disclosed. For example, there are three-layer OLEDs that contain an organic light-emitting layer (LEL) between the HTL and the ETL, such as that disclosed by Adachi et al., "Electroluminescence in Organic Films with Three-Layer Structure", *Japanese Journal of Applied Physics*, 27, L269 (1988), and by Tang et al., "Electroluminescence of Doped Organic Thin Films", *Journal of Applied Physics*, 65, 3610 (1989). The LEL commonly consists of a host material doped with a guest material. Further, there are other multilayer OLEDs that contain more functional layers in the devices. At the same time, many different types of EL materials are also synthesized and used in OLEDs. These new structures and new materials have further resulted in improved device performance.

Operational stability, and operational lifetime, of OLEDs is very important for display applications. The operational lifetime is defined as the time to reach half the initial luminance at a given current density. In order to improve operational stability, many different types of methods have been applied to fabricate OLEDs. For example, using a copper phthalocynine (CuPc) interfacial layer in between an anode and an HTL can improve the operational stability, as reported by Van Slyke et al. in "Organic Electroluminescent Devices with Improved Stability", *Applied Physics Letters*, 69, 2160 (1996); an OLED containing a doped LEL can have improved operational stability, as reported by Hamada et al. in "Influence of the Emission Site on the Running Durability of Organic Electroluminescent Devices", *Japanese Journal of Applied Physics*, 34, L824 (1995) and by Shi et al. in "Doped Organic Electroluminescent Devices with Improved Stability", *Applied Physics Letters*, 70, 1665 (1997); an OLED containing a mixed LEL comprising both a hole-transporting material and an electron-transporting material can also have substantial improvement in the operational stability, as reported by Choong et al. in "Organic Light-Emitting Diodes with a Bipolar Transport Layer", *Applied Physics Letters*, 75, 172 (1999) and by Aziz et al. in "Organic Light Emitting Devices with Enhanced Operational Stability at Elevated Temperatures", *Applied Physics Letters*, 81, 370 (2002).

Currently, OLEDs with red or green emission have better operational stability than that of OLEDs with blue emission (or blue OLEDs). Therefore, improving the operational stability of blue OLEDs will have more impact on device applications. There are several ways to improve the blue emission stability. For example, Shi et al. in "Anthracene Derivatives for Stable Blue-Emitting Organic Electroluminescence Devices", *Applied Physics Letters*, 80, 3201 (2002) and Hosokawa et al. in U.S. patent application 2003/0077480 A1, achieved improved operational stability of blue emission by selecting the appropriate materials. Other new methods for the improvement of the blue emission stability are certainly necessary.

As is known, low work-function metals can be used to dope into an electron-injecting layer (EIL) or ETL which is adjacent to a cathode to improve electron-injection and transport in an OLED. For example, Kido et al. reported in "Bright Organic Electroluminescent Devices Having a Metal-Doped Electron-Injecting Layer", *Applied Physics Letters*, 73, 2866 (1998) and disclosed in U.S. Pat. No. 6,013,384 that an OLED can be fabricated containing a low work-function metal-doped electron-injecting layer adjacent to a cathode. These OLEDs containing a lithium (Li)-doped electron-injecting layer exhibit high luminous efficiency and low drive voltage. However, Li and other metals are reported as being diffusive in organic layer resulting in luminescence quenching in OLEDs, for example, as reported by Haskal et al. in "Lithium-Aluminum Contacts for Organic Light-Emitting Devices", *Applied Physics Letters*, 71, 1151 (1997). An OLED containing a Li-doped tris(8-hydroxyquinoline)aluminum (Alq) layer would also face the problems of luminescence quenching and lifetime shortening, as discussed by Nakamura et al. in U.S. Pat. No. 6,509,109 B1.

SUMMARY OF THE INVENTION

Although it is believed that some organic layers doped with inorganic materials could cause EL quenching and operational stability deterioration in OLEDs, we unexpectedly found that stability enhancing layers, which include at least one organic host material and one inorganic dopant material and is in contact with the LEL can actually improve operational stability.

It is therefore an object of the present invention to improve the operational stability of OLEDs, especially to improve the operational stability of blue emitting OLEDs.

It is another object of the present invention to reduce the drive voltage of OLEDs.

These objects are achieved by An organic light-emitting device comprising:

a) an anode;

b) a hole-transporting layer disposed over the anode;

c) a light-emitting layer disposed over the hole-transporting layer for producing light in response to hole-electron recombination, wherein the light-emitting layer includes at least one organic host material and one organic luminescent dopant material;

d) a stability-enhancing layer disposed in contact with the light-emitting layer, wherein the stability-enhancing layer includes at least one organic host material and one inorganic dopant material;

e) an electron-transporting layer disposed over the stability-enhancing layer; and f) a cathode disposed over the electron-transporting layer.

The present invention makes use of a stability-enhancing layer in an OLED. The OLED containing stability-enhancing layers in accordance with the present invention can increase the operational stability by at least one-fold, although the initial luminance may be about 20% lower than that of the conventional device. Moreover, the OLED containing this stability-enhancing layer can operate at a lower drive voltage compared to the conventional device.

Figure 1:
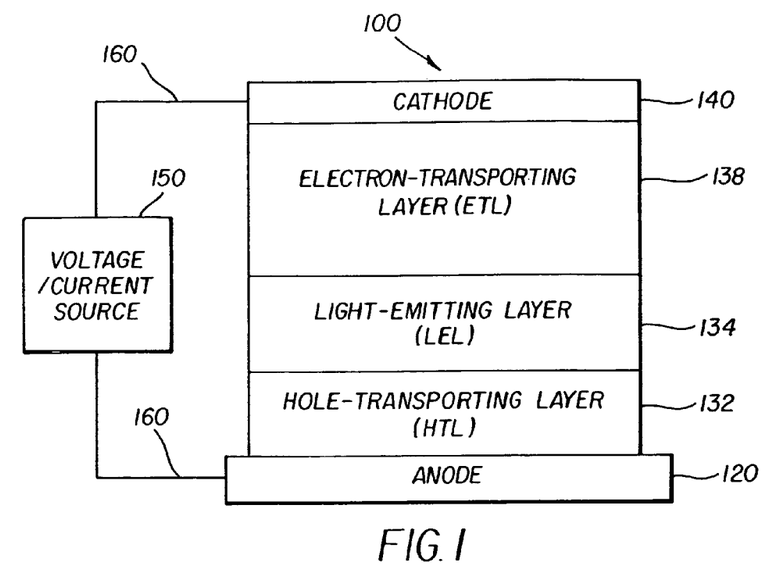
FIG. 1 shows a cross-sectional view of a prior art OLED.
Figure 2:
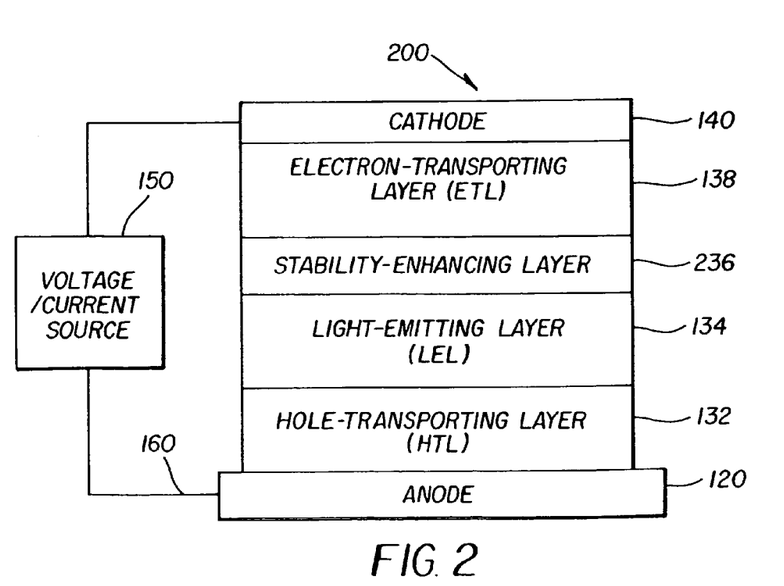
FIG. 2 shows a cross-sectional view of the present invention.

Since device feature dimensions such as layer thicknesses are frequently in sub-micrometer ranges, the drawings of FIGS. 1 and 2 are scaled for ease of visualization rather than dimensional accuracy.

DETAILED DESCRIPTION OF THE INVENTION

FIG. 1 shows an OLED 100 in accordance with a prior art. Conventional OLED 100 has an anode 120 and a cathode 140, at least one of which is transparent. Disposed between the anode 120 and the cathode 140 are at least an HTL 132, a LEL 134, and an ETL 138. This device is externally connected to a voltage/current source 150 through electrical conductors 160.

FIG. 2 shows an OLED 200 in accordance with the present invention. OLED 200 is similar to OLED 100 except that an additional layer, stability-enhancing layer 236, is adjacent to both LEL 134 and ETL 138.

Particular Device Feature—Stability-Enhancing Layer

In a series of patents and applications (U.S. Pat. Nos. 6,396,202 and 6,013,384, and EP 1 011 155, and U.S. patent application Publication 2002/0004146), Kido et al. disclose that an organic layer which functions as an electron-injecting layer in contact with a cathode and comprises an organic compound mixed with either a low work-function metal or a low work-function metal compound can increase the luminous efficiency and lower the drive voltage of an OLED. However, the teachings do not mention any metal- or metal compound-doped layer adjacent to the LEL to improve operational stability. Although it is believed that a metal-doped organic layer could cause EL quenching and operational stability deterioration, we found that an organic layer doped with some inorganic material adjacent to the LEL can actually improve the operational stability. We believe that excessive carrier accumulation at the interface of LEL/ETL will deteriorate the operational stability of the OLED, and reducing or eliminating the carrier accumulation at this interface will increase the operational stability. Therefore, we form a stability-enhancing layer 236 adjacent to both LEL 134 and ETL 138 in the OLED 200 to achieve improved operational stability.

The stability-enhancing layer includes at least one organic host material. In order to not accumulate both holes and electrons at the interface of LEL/stability-enhancing layer during operation, the ionization potential (Ip) of the host material in the stability-enhancing layer is equal to or less than the Ip of the host material in the LEL. Preferably, the Ip of the host material in the stability-enhancing layer is less than the Ip of the host material in the LEL. The host material used in the stability-enhancing layer can be any organic material if it meets the aforementioned Ip specification. However, since this layer is at the cathode side and electrons need to transport from this layer into the LEL, it is important that the stability-enhancing layer should have good electron-transporting properties as well. Therefore, the host material used in the stability-enhancing layer is preferably an electron-transporting material. The host material in the stability-enhancing layer includes metal complexes of 8-hydroxyquinoline(oxine), such as tris(8-hydroxyquinoline) aluminum (Alq).

The stability-enhancing layer also includes at least one inorganic dopant material. In order to further eliminate the accumulation of holes at this interface, we intentionally introduce some impurities into the stability-enhancing layer. These impurities will facilitate the extra holes to be "drained" from this interface into the bulk of the stability-enhancing layer. Although the impurities in the stability-enhancing layer can function as EL quenching centers, if selected properly, the EL quenching effect can be minimized. The impurities used as dopants are selected from inorganic materials. These inorganic dopants include metals or metal compounds. The metal dopant in the stability-enhancing layer can have a work-function lower than 4.0 eV. The metal dopant includes, but is not limited to, alkali metals, alkaline earth metals, or rare earth metals, such as Li, Na, K, Rb, Cs, Mg, Ca, Sr, Ba, La, Ce, Pr, Nd, Sm, Eu, Gd, Th, Dy, Ho, Er, Tm, Yb, Lu, Y, or Mn. The metal dopant in the stability-enhancing layer can also have a work-function equal to or greater than 4.0 eV, such as Al, Ni, Cu, Zn, Ga, Mo, Pd, Ag, In, Sn, Pt, or Au. The metal compound dopant in the stability-enhancing layer includes, but is not limited to, the compounds of alkali metals, alkali earth metals, or rare earth metals, such as the compounds of Li, Na, K, Rb, Cs, Mg, Ca, Sr, Ba, La, Ce, Pr, Nd, Sm, Eu, Gd, Th, Dy, Ho, Er, Tm, Yb, Lu, Y, or Mn. The metal compound in the stability-enhancing layer also includes the compounds of Al, Ni, Cu, Zn, Ga, Mo, Pd, Ag, In, Sn, Pt, or Au. As mentioned previously, it is important for the stability-enhancing layer to have good electron transporting properties. Therefore, the inorganic dopant material used in the stability-enhancing layer is preferably a low work-function metal because the low work-function metal doped in the stability-enhancing layer can improve the electron-transporting properties of this layer. More preferably, the low work-function metal dopant is Li, Na, K, Rb, or Cs. For example, the stability-enhancing layer can be composed of tris(8-hydroxyquinoline)aluminum doped with Li, Na, K, Rb, or Cs. The concentration of the dopant material in the stability-enhancing layer is in the range of from 0.1% to 30% by volume. Preferably, the concentration of the dopant material in the stability-enhancing layer is in the range of from 0.2% to 10% by volume. As mentioned previously, since the stability-enhancing layer is adjacent to the LEL, any impurity diffusion from this layer into the LEL during operation will severely quench the EL and deteriorate the operational stability. Therefore, the host and dopant materials should be selected such that the dopant in the host matrix is strongly bound with the host molecules or is stably situated in the host matrix wherein it does not diffuse into the LEL.

The thickness of the stability-enhancing layer is in the range of from 2 nm to 100 nm. Preferably, the thickness of the stability-enhancing layer is in the range of from 3 nm to 30 nm.

Common Device Features

Substrate

The OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course, it is necessary to provide in these device configurations a light-transparent top electrode.

Anode

When EL emission is viewed through anode 120, the anode should be transparent or substantially transparent to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and any conductive material can be used, regardless if it is transparent, opaque or reflective. Example conductors for this application include, but are not limited to, gold, iridium, molybdenum, palladium, and platinum. Typical anode materials, transmissive or otherwise, have a work function higher than 4.0 eV. Desired anode materials are commonly deposited by any suitable means such as evaporation, sputtering, chemical vapor deposition, or electrochemical means. Anodes can be patterned using well known photolithographic processes. Optionally, anodes may be polished prior to the deposition of other layers to reduce surface roughness so as to minimize electrical shorts or enhance reflectivity.

Hole-Injecting Layer (HIL)

While not always necessary, it is often useful to provide a HIL in contact with anode 120. The HIL can serve to improve the film formation property of subsequent organic layers and to facilitate injection of holes into the HTL reducing the driving voltage of the OLED. Suitable materials for use in the HIL include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA(4,4',4"-tris[(3-ethylphenyl)phenylamino]triphenylamine). Alternative hole-injecting materials reportedly useful in organic EL devices are described in EP 0 891 121 A1 and EP 1 029 909 A1.

A p-type doped organic layer is also useful for the HIL as described in U.S. Pat. No. 6,423,429 B2. A p-type doped organic layer means that the layer is electrically conductive, and the charge carriers are primarily holes. The conductivity is provided by the formation of a charge-transfer complex as a result of electron transfer from the host material to the dopant material.

Hole-Transporting Layer (HTL)

HTL 132 in the OLED contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The HTL can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials.

In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrene-sulfonate) also called PEDOT/PSS.

Light-Emitting Layer (LEL)

As more fully described in U.S. Pat. Nos. 4,769,292 and 5,935,721, the LEL 134 in OLED 200 includes a luminescent or fluorescent material where electroluminescence is produced as a result of hole-electron pair recombination in this region. The LEL can be comprised of at least one host material doped with a guest compound or compounds where light emission occurs primarily from the dopant and can be of any color. The host materials in the LEL can be an electron-transporting material, a hole-transporting material, or another material or combination of materials that support hole-electron recombination. The dopant is usually selected from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes, e.g., poly(p-phenylenevinylene), PPV, can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the electron energy band gap. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine[alias,tris(8-quinolinolato)aluminum(III)]
CO-2: Magnesium bisoxine[alias,bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine[alias,tris(8-quinolinolato)indium]
CO-6: Aluminum tris(5-methyloxine)[alias,tris(5-methyl-8-quinolinolato)aluminum(III)]
CO-7: Lithium oxine[alias,(8-quinolinolato)lithium(I)]
CO-8: Gallium oxine[alias,tris(8-quinolinolato)gallium(III)]
CO-9: Zirconium oxine[alias,tetra(8-quinolinolato)zirconium(IV)].

Other classes of useful host materials include, but are not limited to, derivatives of anthracene, such as 2-(1,1-dimethyethyl)-9,10-bis(2-naphthalenyl)anthracene (TBADN), 9,10-di-(2-naphthyl)anthracene (ADN), and derivatives thereof as described in U.S. Pat. No. 5,935,721, distyrylarylene derivatives as described in U.S. Pat. No. 5,121,029, benzazole derivatives, for example, 2,2',2''-(1,3,5-phenylene)tris[1-phenyl-1H-benzimidazole], and blue emitting metal chelated oxinoid compounds, for example, Bis(2-methyl-8-quinolinolato)(4-phenylphenolato)aluminum (B-Alq). Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

In the present invention, the thickness of the LEL 134 is in the range of from 5 nm to 45 nm. Preferably, the thickness of the light-emitting layer is in the range of from 5 nm to 30 nm. More preferably, the thickness of the light-emitting layer is in the range of from 5 nm to 20 nm.

Electron-Transporting Layer (ETL)

Preferred thin film-forming materials for use in forming the ETL 138 in the OLED 200 are metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds are the following:

CO-1: Aluminum trisoxine[alias,tris(8-quinolinolato)aluminum(III)]
CO-2: Magnesium bisoxine[alias,bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine[alias,tris(8-quinolinolato)indium]
CO-6: Aluminum tris(5-methyloxine)[alias,tris(5-methyl-8-quinolinolato)aluminum(III)]
CO-7: Lithium oxine[alias,(8-quinolinolato)lithium(I)]
CO-8: Gallium oxine[alias,tris(8-quinolinolato)gallium(III)]
CO-9: Zirconium oxine[alias,tetra(8-quinolinolato)zirconium(IV)]

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, and some silole derivatives are also useful electron-transporting materials.

In the present invention, the ETL 138 can comprise the same material used in forming the stability-enhancing layer 236. However, since the stability-enhancing layer 236 mainly functions to increase the operational stability and the ETL 138 function is to improve the electron-injection and electron-transport properties, each of the two layers should have its own optimized material selection. Therefore, it is preferred, but not be limited to, that the ETL is different from the stability-enhancing layer such that the host material may be different, or the dopant material may be different, or the dopant concentration may be different.

Electron-Injecting Layer (EIL)

While not always necessary, it is often useful to provide an EIL in contact to the cathode 140. The EIL can serve to facilitate injection of electrons into the ETL and to increase the electrical conductivity resulting in a low driving voltage of the OLED as described in U.S. Pat. No. 6,013,384. Suitable materials for use in the EIL are the aforementioned ETL with strong reducing agents as dopants or with low work function metals (<3.0 eV) as dopants to form an n-type doped organic layer. An n-type doped organic layer means that the layer is electrically conductive, and the charge carriers are primarily electrons. The conductivity is provided by the formation of a charge-transfer complex as a result of electron transfer from the dopant material to the host material. Alternative inorganic electron-injecting materials can also be useful to form an EIL in the OLED. The inorganic EIL preferably includes a low work-function metal or metal salt, such as a 0.5~1 nm LiF layer as described in U.S. Pat. No. 5,677,572.

Cathode

When light emission is viewed solely through the anode, the cathode 140 used in the present invention can be comprised of nearly any conductive material. Desirable materials have good film-forming properties to ensure good contact with the underlying organic layer, promote electron injection at low voltage, and have good stability. Useful cathode materials often contain a low work-function metal (<4.0 eV) or metal alloy. One preferred cathode material is comprised of a MgAg alloy wherein the percentage of silver is in the range of 1 to 20%, as described in U.S. Pat. No. 4,885,221. Another suitable class of cathode materials includes bilayers comprising a thin inorganic EIL (as aforementioned) in contact with an organic layer (e.g., ETL), which is capped with a thicker layer of a conductive metal. If the inorganic EIL includes a low work-function metal or metal salt, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,393; and JP 3,234,963; and EP 1 076 368. Cathode materials are typically deposited by thermal evaporation, electron-beam evaporation, ion sputtering, or chemical vapor deposition. When needed, patterning can be achieved through many well known methods including, but not limited to, through-mask deposition, integral shadow masking, for example as described in U.S. Pat. No. 5,276,380 and EP 0 732 868, laser ablation, and selective chemical vapor deposition.

Other Device Features

Alternative Layers

In some instances, organic HIL, which can optionally be named as HTL, serves the function of supporting both hole-injection and hole-transport, and organic EIL, which can optionally be named as ETL, serves the function of supporting both electron-injection and electron-transport. It is also known in the art that emitting dopants may be added to an HTL, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in U.S. patent application Publication 2002/0025419 A1; U.S. Pat. Nos. 5,683,823; 5,503,910; 5,405,709; 5,283,182; EP 1 187 235; and EP 1 182 244.

Additional layers such as an electron-blocking layer at the anode side and adjacent to the LEL as taught in the art may be employed in devices of the present invention.

Deposition of Organic Layers

The organic materials mentioned above are suitably deposited through a vapor-phase method such as thermal evaporation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by thermal evaporation can be vaporized from an evaporation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate evaporation boats or the materials can be pre-mixed and coated from a single boat or donor sheet. For full color display, the pixelation of LELs may be needed. This pixelated deposition of LELs can be achieved using shadow masks, integral shadow masks (U.S. Pat. No. 5,294,870), spatially-defined thermal dye transfer from a donor sheet (U.S. Pat. Nos. 5,688,551; 5,851,709; and 6,066,357) and inkjet method (U.S. Pat. No. 6,066,357).

Encapsulation

Most OLEDs are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of the present invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention can be employed in most OLED configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

The entire contents of the patents and other publications referred to in this specification are incorporated herein by reference.

EXAMPLES

The present invention and its advantages can be better appreciated by the following inventive and comparative examples. For purposes of brevity, the materials and layers formed therefrom will be abbreviated as given below.

ITO: indium-tin-oxide; used in forming the transparent anode on glass substrates.
CFx: polymerized fluorocarbon layer; used in forming a hole-injecting layer on top of ITO.
NPB: N,N'-di(naphthalene-1-yl)-N,N'-diphenyl-benzidine; used in forming the hole-transporting layer.
TBADN: 2-(1,1-dimethyethyl)-9,10-bis(2-naphthalenyl)anthracene; used as the host material in forming the light-emitting layer.
TBP: 2,5,8,11-tetra-t-butylperylene; used as the dopant material in the light-emitting layer.
Alq: tris(8-hydroxyquinoline)aluminum(III); used in forming the electron-transporting layer, or used as a host material in the stability-enhancing layer.
Bphen: 4,7-diphenyl-1,10-phenanthroline; used in forming the electron-transporting transporting layer.
Li lithium; used as n-type dopant in forming the n-type doped electron-transporting layer, or used as an inorganic dopant material in the stability-enhancing layer.
MgAg: magnesium:silver at a ratio of 10:0.5 by volume; used in forming the cathode.

In the following examples, the thickness of the organic layers and the doping concentration were controlled and measured in situ using calibrated thickness monitors (INFICON IC/5 Deposition Controller). The Ip of some organic films was measured using an ultraviolet photoelectron spectroscopy in a photoelectron spectroscopy system (THERMO VG ESCALAB-250). The electroluminescence characteristics of all the fabricated devices were evaluated using a constant current source (KEITHLEY 2400 SourceMeter) and a photometer (PHOTO RESEARCH SpectraScan PR 650) at room temperature. The color was reported using Commission Internationale de l'Eclairage (CIE) coordinates, CIEx,y. During the operational lifetime test, the devices being tested were driven at a current density of 20 mA/cm$^2$ in a 70° C. oven (VWR Scientific Products).

Example 1

Comparative Example

The preparation of a conventional OLED is as follows: A~1.1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the HIL by decomposing CHF$_3$ gas in an RF plasma treatment chamber. The substrate was then transferred into a vacuum deposition chamber (TROVATO MFG. INC) for deposition of all other layers on top of the substrate. All organic materials were sublimed before use. The following layers were deposited in the following sequence by evaporation from a heated boat under a vacuum of approximately 10$^{-6}$ Torr:

(1) a HTL, 90 nm thick, consisting of NPB;
(2) a LEL, 20 nm thick, consisting of TBADN doped with 1.5% TBP by volume;
(3) an ETL, 35 nm thick, consisting of Alq; and
(4) a cathode, approximately 210 nm thick, consisting of MgAg.

Figure 3:
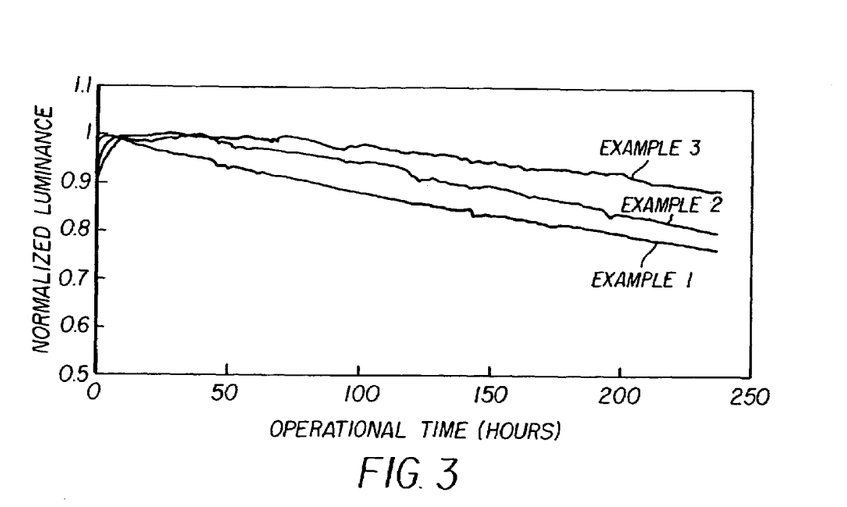
FIG. 3 is a graph, showing normalized luminance versus operational time, demonstrating the operational stability of the OLEDs fabricated in accordance with the present invention as well as the prior art.

After the deposition of these layers, the device was transferred from the deposition chamber into a dry box (VAC Vacuum Atmosphere Company) for encapsulation. The completed device structure is denoted as ITO/CFx/NPB (90)/TBADN:TBP(1.5%)(20)/Alq(35)/MgAg. The EL performance of the device, measured at a current density of 20 mA/cm$^2$, is shown in Table I, wherein the drive voltage, luminance, luminous efficiency, power efficiency, color coordinates CIEx,y, and the $T_{90}$(70° C.) (a time at which the luminance retains 90% of its initial value after being operated at 70° C.) are listed. The normalized luminance vs. operational time is shown in FIG. 3.

Example 2

An OLED was constructed in the manner described in Example 1, except that one more layer was added onto the LEL. The layers were deposited in the following sequence:

(1) a HTL, 90 nm thick, consisting of NPB;
(2) a LEL, 20 nm thick, consisting of TBADN doped with 1.5% TBP by volume;
(3) a stability-enhancing layer, 2.5 nm thick, consisting of Alq doped with 1.2% Li by volume;
(4) an ETL, 32.5 nm thick, consisting of Alq; and
(5) a cathode, approximately 210 nm thick, consisting of MgAg.

The completed device structure is denoted as ITO/CFx/ NPB(90)/TBADN:TBP(1.5%)(20)/Alq:Li(1.2%)(2.5)/Alq (32.5)/MgAg. The EL performance of the device, measured at a current density of 20 mA/cm$^2$, is shown in Table I, wherein the drive voltage, luminance, luminous efficiency, power efficiency, color coordinates CIEx,y, and the $T_{90}$(70° C.) are listed. The normalized luminance vs. operational time is shown in FIG. 3.

Example 3

An OLED was constructed in the manner described in Example 2, except in Step (3) wherein the thickness of the stability-enhancing layer is now increased to 15 nm, and except in Step (4) wherein the thickness of the ETL is now reduced to 20 nm. The completed device structure is denoted as ITO/CFx/NPB(90)/TBADN:TBP(1.5%)(20)/Alq:Li (1.2%)(1.5)/Alq(20)/MgAg. The EL performance of the device, measured at a current density of 20 mA/cm$^2$, is shown in Table I, wherein the drive voltage, luminance, luminous efficiency, power efficiency, color coordinates CIEx,y, and the $T_{90}$(70° C.) are listed. The normalized luminance vs. operational time is shown in FIG. 3.

TABLE I

| Example (Type) (EL measured @ 20 mA/cm²) | Voltage (V) | Luminance (cd/m²) | Luminous Efficiency (cd/A) | Power Efficiency (lm/W) | CIEy | CIEy | $T_{90}$ (70° C.) (Hrs) |
|---|---|---|---|---|---|---|---|
| 1 (Comparative) | 8.49 | 422 | 2.11 | 0.78 | 0.142 | 0.213 | 84 |
| 2 (Inventive) | 9.04 | 390 | 1.95 | 0.68 | 0.134 | 0.194 | 135 |
| 3 (Inventive) | 8.32 | 374 | 1.87 | 0.71 | 0.134 | 0.202 | 218 |

From the data shown in both Table I and FIG. 3, we find that although the OLEDs containing a stability-enhancing layer reduce their power efficiencies by about 10%, their operational stability is substantially improved. With the increase of the thickness from 2.5 nm to 15 nm, the $T_{90}$(70° C.) of the OLED increased from 135 hrs to 218 hrs.

Example 4

Comparative Example

Figure 4:
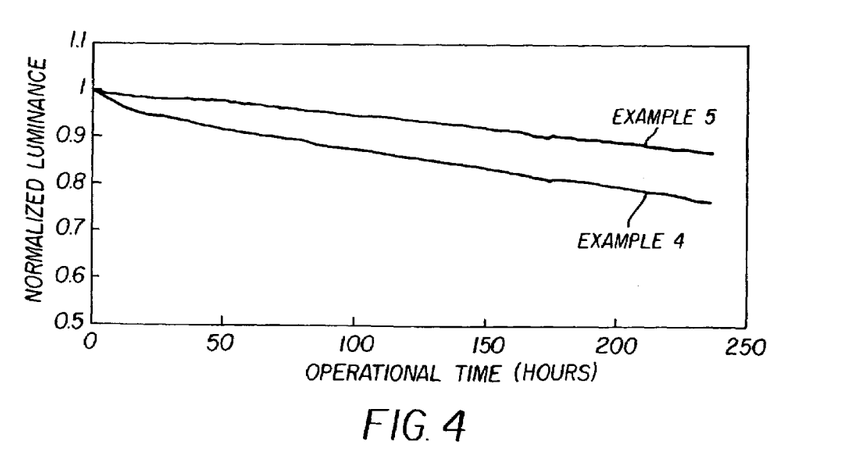
FIG. 4 is a graph, showing normalized luminance versus operational time, demonstrating the operational stability of the other OLED fabricated in accordance with the present invention as well as the prior art.

An OLED was constructed in the manner described in Example 1, except that the organic material TBADN was further purified by an additional sublimation step. The completed device structure is denoted as ITO/CFx/NPB(90)/TBADN:TBP(1.5%)(20)/Alq(35)/MgAg. The EL performance of the device, measured at a current density of 20 mA/cm², is shown in Table II, wherein the drive voltage, luminance, luminous efficiency, power efficiency, color coordinates CIEx,y, and the $T_{90}$(70° C.) are listed. The normalized luminance vs. operational time is shown in FIG. 4.

Example 5

An OLED was constructed in the manner described in Example 4, except that one more layer was added adjacent to the LEL and the ETL was replaced by Bphen:Li. The layers were deposited in the following sequence:
(1) a HTL, 90 nm thick, consisting of NPB;
(2) a LEL, 20 nm thick, consisting of TBADN doped with 1.5% TBP by volume;
(3) a stability-enhancing layer, 10 nm thick, consisting of Alq doped with 1.2% Li by volume;
(4) an ETL, 25 nm thick, consisting of Bphen doped with 1.0% Li by volume; and
(5) a cathode, approximately 210 nm thick, consisting of MgAg.

The completed device structure is denoted as ITO/CFx/NPB (90)/TBADN:TBP(1.5%)(20)/Alq:Li(1.2%)(10)/Bphen:Li (1.0%)(25)/MgAg. The EL performance of the device, measured at a current density of 20 mA/cm², is shown in Table II, wherein the drive voltage, luminance, luminous efficiency, power efficiency, color coordinates CIEx,y, and the $T_{90}$(70° C.) are listed. The normalized luminance vs. operational time is shown in FIG. 4.

From the data shown in both Table II and FIG. 4, we find that although the OLEDs containing a stability-enhancing layer reduce their power efficiencies by about 10%, their operational stability is substantially improved.

The invention has been described in detail with particular reference to certain preferred embodiments thereof, but it will be understood that variations and modifications can be effected within the spirit and scope of the invention.

PARTS LIST

100 Oled (prior art)
120 Anode
132 Hole-transporting layer, HTL
134 Light-emitting layer, LEL
138 Electron-transporting layer, ETL
140 Cathode
150 Voltage/current source
160 Electrical conductors
200 OLED (present invention)
236 Stability-enhancing layer

What is claimed is:

1. An organic light-emitting device comprising:
   a) an anode;
   b) a hole-transporting layer disposed over the anode;
   c) a light-emitting layer disposed over the hole-transporting layer for producing light in response to hole-electron recombination, wherein the light-emitting layer includes at least one organic host material and one organic luminescent dopant material;
   d) a stability-enhancing layer disposed in contact with the light-emitting layer, wherein the stability-enhancing layer includes at least one organic host material and one inorganic dopant material;
   e) an electron-transporting layer disposed over the stability-enhancing layer; and
   f) a cathode disposed over the electron-transporting layer.

2. The organic light-emitting device of claim 1 wherein the host material in the stability-enhancing layer is selected from electron-transporting materials.

3. The organic light-emitting device of claim 2 wherein the ionization potential of the host material in the stability-enhancing layer is equal to or less than the ionization potential of the host material in the light-emitting layer.

TABLE II

| Example (Type) (EL measured @ 20 mA/cm²) | Voltage (V) | Luminance (cd/m²) | Luminous Efficiency (cd/A) | Power Efficiency (lm/W) | CIEy | CIEy | $T_{90}$ (70° C.) (Hrs) |
|---|---|---|---|---|---|---|---|
| 4 (Comparative) | 7.60 | 661 | 3.30 | 1.37 | 0.142 | 0.207 | 73 |
| 5 (Inventive) | 6.22 | 508 | 2.54 | 1.28 | 0.133 | 0.185 | 193 |

4. The organic light-emitting device of claim 2 wherein the host material in the stability-enhancing layer includes metal complexes of 8-hydroxyquinoline.

5. The organic light-emitting device of claim 2 wherein the host material in the stability-enhancing layer includes tris(8-hydroxyquinoline)aluminum.

6. The organic light-emitting device of claim 1 wherein the inorganic dopant material in the stability-enhancing layer is a metal or metal compound.

7. The organic light-emitting device of claim 6 wherein the dopant in the stability-enhancing layer has a work-function lower than 4.0 eV.

8. The organic light-emitting device of claim 6 wherein the dopant in the stability-enhancing layer includes alkali metals, alkaline earth metals, or rare earth metals.

9. The organic light-emitting device of claim 6 wherein the dopant in the stability-enhancing layer includes Li, Na, K, Rb, Cs, Mg, Ca, Sr, Ba, La, Ce, Pr, Nd, Sm, Eu, Gd, Th, Dy, Ho, Er, Tm, Yb, Lu, Y, or Mn.

10. The organic light-emitting device of claim 6 wherein the dopant in the stability-enhancing layer has a work-function equal to or higher than 4.0 eV.

11. The organic light-emitting device of claim 6 wherein the dopant in the stability-enhancing layer includes Al, Ni, Cu, Zn, Ga, Mo, Pd, Ag, In, Sn, Pt, or Au.

12. The organic light-emitting device of claim 6 wherein the dopant in the stability-enhancing layer includes the compounds of alkali metals, alkaline earth metals, or rare earth metals.

13. The organic light-emitting device of claim 6 wherein the dopant in the stability-enhancing layer includes the compounds of Li, Na, K, Rb, Cs, Mg, Ca, Sr, Ba, La, Ce, Pr, Nd, Sm, Eu, Gd, Th, Dy, Ho, Er, Tm, Yb, Lu, Y, or Mn.

14. The organic light-emitting device of claim 6 wherein the dopant in the stability-enhancing layer includes the compounds of Al, Ni, Cu, Zn, Ga, Mo, Pd, Ag, In, Sn, Pt, or Au.

15. The organic light-emitting device of claim 6 wherein the concentration of the dopant material in the stability-enhancing layer is in the range of from 0.1% to 30% by volume.

16. The organic light-emitting device of claim 6 wherein the concentration of the dopant material in the stability-enhancing layer is in the range of from 0.2% to 10% by volume.

17. The organic light-emitting device of claim 1 wherein the stability-enhancing layer includes tris(8-hydroxyquinoline)aluminum doped with Li, Na, K, Rb, or Cs.

18. The organic light-emitting device of claim 1 wherein the thickness of the stability-enhancing layer is in the range of from 2 nm to 100 nm.

19. The organic light-emitting device of claim 1 wherein the thickness of the stability-enhancing layer is in the range of from 3 nm to 30 nm.

20. The organic light-emitting device of claim 1 wherein the thickness of the light-emitting layer is in the range of from 5 nm to 45 nm.

21. The organic light-emitting device of claim 1 wherein the thickness of the light-emitting layer is in the range of from 5 nm to 30 nm.

22. An organic light-emitting device comprising:
a) an anode;
b) a hole-transporting layer disposed over the anode;
c) a light-emitting layer disposed over the hole-transporting layer for producing light in response to hole-electron recombination, wherein the light-emitting layer includes at least one organic host material and one organic luminescent dopant material;
d) a stability-enhancing layer disposed in contact with the light-emitting layer, wherein the stability-enhancing layer includes at least one organic host material and one morganic dopant material;
e) an electron-transporting layer disposed over the stability-enhancing layer, wherein the electron-transporting layer includes host material or dopant material or dopant concentration that are different than the host material or dopant material or dopant concentration in the stability-enhancing layer; and
f) a cathode disposed over the electron-transporting layer.

23. The organic light-emitting device of claim 22 wherein the host material in the stability-enhancing layer is selected from electron-transporting materials.

24. The organic light-emitting device of claim 23 wherein the ionization potential of the host material in the stability-enhancing layer is equal to or less than the ionization potential of the host material in the light-emitting layer.

25. The organic light-emitting device of claim 23 wherein the host material in the stability-enhancing layer includes metal complexes of 8-hydroxyquinoline.

26. The organic light-emitting device of claim 23 wherein the host material in the stability-enhancing layer includes tris(8-hydroxyquinoline)aluminum.

27. The organic light-emitting device of claim 22 wherein the inorganic dopant material in the stability-enhancing layer is a metal or metal compound.

28. The organic light-emitting device of claim 27 wherein the dopant in the stability-enhancing layer has a work-function lower than 4.0 eV.

29. The organic light-emitting device of claim 27 wherein the dopant in the stability-enhancing layer includes alkali metals, alkaline earth metals, or rare earth metals.

30. The organic light-emitting device of claim 27 wherein the dopant in the stability-enhancing layer includes Li, Na, K, Rb, Cs, Mg, Ca, Sr, Ba, La, Ce, Pr, Nd, Sm, Eu, Gd, Th, Dy, Ho, Er, Tm, Yb, Lu, Y, or Mn.

31. The organic light-emitting device of claim 27 wherein the dopant in the stability-enhancing layer has a work-function equal to or higher than 4.0 eV.

32. The organic light-emitting device of claim 27 wherein the dopant in the stability-enhancing layer includes Al, Ni, Cu, Zn, Ga, Mo, Pd, Ag, In, Sn, Pt, or Au.

33. The organic light-emitting device of claim 27 wherein the compound dopant in the stability-enhancing layer includes the compounds of alkali metals, alkaline earth metals, or rare earth metals.

34. The organic light-emitting device of claim 27 wherein the compound dopant in the stability-enhancing layer includes the compounds of Li, Na, K, Rb, Cs, Mg, Ca, Sr, Ba, La, Ce, Pr, Nd, Sm, Eu, Gd, Th, Dy, Ho, Er, Tm, Yb, Lu, Y, or Mn.

35. The organic light-emitting device of claim 27 wherein the compound dopant in the stability-enhancing layer includes the compounds of Al, Ni, Cu, Zn, Ga, Mo, Pd, Ag, In, Sn, Pt, or Au.

36. The organic light-emitting device of claim 27 wherein the concentration of the dopant material in the stability-enhancing layer is in the range of from 0.1% to 30% by volume.

37. The organic light-emitting device of claim 27 wherein the concentration of the dopant material in the stability-enhancing layer is in the range of from 0.2% to 10% by volume.

38. The organic light-emitting device of claim 22 wherein the stability-enhancing layer includes tris(8-hydroxyquinoline)aluminum doped with Li, Na, K, Rb, or Cs.

39. The organic light-emitting device of claim 22 wherein the thickness of the stability-enhancing layer is in the range of from 2 nm to 100 nm.

40. The organic light-emitting device of claim 22 wherein the thickness of the stability-enhancing layer is in the range of from 3 nm to 30 nm.

41. The organic light-emitting device of claim 22 wherein the thickness of the light-emitting layer is in the range of from 5 nm to 45 nm.

42. The organic light-emitting device of claim 22 wherein the thickness of the light-emitting layer is in the range of from 5 nm to 30 nm.

* * * * *

UNITED STATES PATENT AND TRADEMARK OFFICE
CERTIFICATE OF CORRECTION

PATENT NO. : 7,138,763 B2  
APPLICATION NO. : 10/713523  
DATED : November 21, 2006  
INVENTOR(S) : Liang-Sheng Liao et al.

Page 1 of 1

It is certified that error appears in the above-identified patent and that said Letters Patent is hereby corrected as shown below:

Col. 15, line 18     Please replace "Th," with --Tb,--

Col. 15, line 33     Please replace "Th," with --Tb,--

Col. 16, line 38     Please replace "Th," with --Tb,--

Col. 16, line 52     Please replace "Th," with --Tb,--

Signed and Sealed this

Tenth Day of April, 2007

JON W. DUDAS  
*Director of the United States Patent and Trademark Office*